US007567143B2

(12) United States Patent
Mori et al.

(10) Patent No.: US 7,567,143 B2
(45) Date of Patent: Jul. 28, 2009

(54) BALANCED-UNBALANCED TRANSFORMATION DEVICE AND METHOD FOR MANUFACTURING BALANCED-UNBALANCED TRANSFORMATION DEVICE

(75) Inventors: Hirotsugu Mori, Yasu (JP); Motoharu Hiroshima, Shiga-ken (JP); Hideyuki Kato, Moriyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/129,951

(22) Filed: May 30, 2008

(65) Prior Publication Data

US 2008/0224796 A1 Sep. 18, 2008

Related U.S. Application Data

(63) Continuation of application No. PCT/JP2007/062754, filed on Jun. 26, 2007.

(30) Foreign Application Priority Data

Sep. 29, 2006 (JP) ............................ 2006-268588

(51) Int. Cl.
*H03H 7/42* (2006.01)
*H01P 3/08* (2006.01)

(52) U.S. Cl. ........................................ 333/26; 333/204

(58) Field of Classification Search ................... 333/25, 333/26, 204; 336/192, 200
See application file for complete search history.

(56) References Cited

U.S. PATENT DOCUMENTS 7,106,161 B2 * 9/2006 Tozawa et al. .............. 336/200
7,126,444 B2 * 10/2006 Fukunaga et al. ........... 333/204

FOREIGN PATENT DOCUMENTS

| | | |
|---|---|---|
| JP | 63-209203 | 8/1988 |
| JP | 7-162213 | 6/1995 |
| JP | 10-290107 | 10/1998 |
| JP | 10-335911 | 12/1998 |
| JP | 2000-353904 | 12/2000 |
| JP | 2003-504930 | 2/2003 |
| WO | WO-01/05029 | 1/2001 |

OTHER PUBLICATIONS

PCT/JP2007/062754 Written Opinion dated Jul. 13, 2007.
PCT/JP2007/062754 International Search Report dated Jul. 13, 2007.
PCT/JP2007/062754 Copy of Written Opinion dated Jul. 13, 2007.
PCT/JP2007/062754 Copy of International Search Report dated Jul. 13, 2007.

* cited by examiner

*Primary Examiner*—Dean O Takaoka
(74) *Attorney, Agent, or Firm*—Dickstein Shapiro LLP

(57) ABSTRACT

A balanced-unbalanced transformation device includes a plate-like dielectric substrate having a ground electrode and a plurality of major surface electrodes formed thereon. Two of the major surface electrodes are connected to the ground electrode via short-circuit side surface electrodes so as to form ¼ wavelength resonator transmission lines. A third major surface electrode is disposed between the two major surface electrodes and has either end open so as to form a ½ wavelength resonator transmission line. A balancing characteristic adjustment side surface electrode is provided on a side surface of the dielectric substrate. By adjusting a capacitance formed between the balancing characteristic adjustment side surface electrode and the third major surface electrode, a phase balance between two balanced signals is set to a desired value.

10 Claims, 6 Drawing Sheets

(A)

(B)

(C)

(A)

(B)

(A)

(B)

BALANCED-UNBALANCED TRANSFORMATION DEVICE AND METHOD FOR MANUFACTURING BALANCED-UNBALANCED TRANSFORMATION DEVICE

CROSS REFERENCE TO RELATED APPLICATIONS

The present application is a continuation of International Application No. PCT/JP2007/062754, filed Jun. 26, 2007, which claims priority to Japanese Patent Application No. JP2006-268588, filed Sep. 29, 2006, the entire contents of each of these applications being incorporated herein by reference in their entirety.

FIELD OF THE INVENTION

The present invention relates to a balanced-unbalanced transformation device including a balanced terminal and an unbalanced terminal and a method for manufacturing the balanced-unbalanced transformation device.

BACKGROUND OF THE INVENTION

A plurality of types of balanced-unbalanced transformation device have been proposed that perform balanced-unbalanced conversion by having one ½ wavelength resonator and two ¼ wavelength resonators formed on a dielectric substrate.

FIG. 1 illustrates the structure of a balanced-unbalanced transformation device described in Patent Document 1. A balanced-unbalanced transformation device 101 includes a plurality of laminated dielectric substrates. The balanced-unbalanced transformation device 101 further includes a ground terminal (not shown) on each of an upper side surface A and a lower side surface B thereof, an unbalanced terminal (not shown) on a left side surface C thereof, and two balanced terminals (not shown) on a right side surface D thereof. As shown in the drawing, an unbalanced pattern 102 is formed on a major surface of the uppermost dielectric substrate layer. The unbalanced pattern 102 serves as an electrode of a ½ wavelength resonator. In addition, a balanced pattern 103A and a balanced pattern 103B are formed on the lowermost dielectric substrate layer. The balanced pattern 103A and the balanced pattern 103B serve as electrodes of different ¼ wavelength resonators.

The unbalanced pattern 102 is an electrode that is substantially U shaped. The unbalanced pattern 102 includes line portions 102A and 102B disposed parallel to each other, a line portion 102C that connects the line portion 102A to the line portion 102B, a lead-out electrode 102D used for connection with the ground electrode, and a lead-out electrode 102E used for connection with the unbalanced terminal. Each of the balanced patterns 103A and 103B is an electrode pattern that is substantially I shaped. The line portions 102A and 102B of the unbalanced pattern 102 face the balanced pattern 103A or 103B with a first dielectric substrate therebetween.

The balanced-unbalanced transformation device 101 converts an unbalanced signal input to the unbalanced terminal into first and second balanced signals, and outputs a first balanced signal from one of the balanced terminals. In addition, the balanced-unbalanced transformation device 101 outputs, from the other balanced terminal, a second balanced signal having a phase substantially opposite to that of the first balanced signal.

When, conversely, a balanced signal is input to the two balanced terminals, the balanced-unbalanced transformation device 101 converts the balanced signal into an unbalanced signal, and outputs the unbalanced signal from the unbalanced terminal.

[Patent Document 1] Japanese Unexamined Patent Application Publication No. 10-290107

In general, the performance of a balanced-unbalanced transformation device is evaluated by using the width of a frequency range in which the phase difference and the amplitude difference between two balanced signals are within desired ranges.

However, in the balanced-unbalanced transformation device described in Patent Document 1, the shape of the unbalanced pattern 102 and the arrangement of the balanced patterns 103A and 103B are asymmetrical. Accordingly, the frequency range in which a desired balancing characteristic is provided is disadvantageously narrow.

SUMMARY OF THE INVENTION

Accordingly, the present invention provides a balanced-unbalanced transformation device capable of providing a desired balancing characteristic in a wide frequency range and a method for easily manufacturing the balanced-unbalanced transformation device.

According to the present invention, a balanced-unbalanced transformation device includes first and second ¼ wavelength resonator transmission lines, each facing a ground electrode with a dielectric substrate therebetween and having one end short-circuited and the other end open-circuited, a ½ wavelength resonator transmission line including a first line portion disposed in the vicinity of the first ¼ wavelength resonator transmission line and a second line portion disposed in the vicinity of the second ¼ wavelength resonator transmission line, where the ½ wavelength resonator transmission line faces the ground electrode with the dielectric substrate therebetween and has either end open-circuited, a first balanced terminal connected to the first ¼ wavelength resonator transmission line, a second balanced terminal connected to the second ¼ wavelength resonator transmission line, an unbalanced terminal connected to the ½ wavelength resonator transmission line, and a balancing characteristic adjustment electrode having one end connected to the ground electrode. The balancing characteristic adjustment electrode faces a side of a portion of the ½ wavelength resonator transmission line located between the first and second line portions.

According to the invention, since the balancing characteristic adjustment electrode faces a side of the ½ wavelength resonator transmission line, a capacitance is formed between the balancing characteristic adjustment electrode and the ½ wavelength resonator transmission line. In general, a portion that serves as an equivalent short-circuited end of the ½ wavelength resonator transmission line appears at substantially the middle of the ½ wavelength resonator transmission line. By using the balancing characteristic adjustment electrode according to the invention and the formed capacitance, the position of the equivalent short-circuited end of the ½ wavelength resonator transmission line can be shifted using the capacitance. In this way, the phase difference and the amplitude difference between two balanced signals of the balanced-unbalanced transformation device can be adjusted.

Accordingly, by changing the capacitance to an appropriate value, variations in the phase difference and the amplitude difference between two balanced signals with respect to a frequency can be reduced. In this way, two balanced signals having the phase difference and the amplitude difference within a predetermined range can be obtained over a wide frequency range.

According to an aspect of the present invention, the open-circuited ends of the first and second ¼ wavelength resonator transmission lines extend in the same direction, and the open-circuited end of the ½ wavelength resonator transmission line extends in a direction opposite the direction in which the open-circuited ends of the first and second ¼ wavelength resonator transmission lines extend.

In such a structure, the first and second ¼ wavelength resonator transmission lines are interdigitally and strongly connected to the ½ wavelength resonator transmission line. In this way, two balanced signals having the phase difference and the amplitude difference within a predetermined range can be obtained over a wider frequency range.

According to the balanced-unbalanced transformation device of the present invention, the balancing characteristic adjustment electrode includes a side surface electrode extending on a side surface of the dielectric substrate and a major surface electrode disposed on a major surface of the dielectric substrate having the first and second ¼ wavelength resonator transmission lines and the ½ wavelength resonator transmission line extending thereon.

In such a structure, the major surface electrode of the balancing characteristic adjustment electrode can also generate the capacitance. Accordingly, the need for extending the ½ wavelength resonator transmission line to the vicinity of the side surface having the balancing characteristic adjustment electrode thereon is eliminated. Consequently, the layout of the ½ wavelength resonator transmission line can be freely determined, and therefore, the setting range of the resonance characteristics of the resonator transmission lines can be increased.

According to the balanced-unbalanced transformation device of the present invention, the major surface electrode of the balancing characteristic adjustment electrode has a convex shape partially protruding towards a side of the ½ wavelength resonator transmission line.

In such a structure, the capacitance can be determined by changing the width of the portion having a convex shape. In this way, the phase difference and the amplitude difference between two balanced signals of the balanced-unbalanced transformation device can be adjusted more finely.

According to the balanced-unbalanced transformation device of the present invention, the balanced-unbalanced transformation device further includes first and second lead-out electrodes disposed on a side surface of the dielectric substrate having the side surface electrode of the balancing characteristic adjustment electrode thereon. The first lead-out electrode electrically connects the first balanced terminal to the first ¼ wavelength resonator transmission line, and the second lead-out electrode electrically connects the second balanced terminal to the second ¼ wavelength resonator transmission line. The first lead-out electrode, the side surface electrode of the balancing characteristic adjustment electrode, and the second lead-out electrode are disposed at equal intervals.

In such a structure, the electrode patterns of the balanced-unbalanced transformation device can be brought close to line-symmetrical patterns. In addition, when the circuit is formed, the risk of the occurrence of unwanted connection between the side electrodes can be reduced. Furthermore, since the side surface electrode of the balancing characteristic adjustment electrode is disposed in very close proximity of the equivalent short-circuited end of the ½ wavelength resonator transmission line, variations in the phase difference and the amplitude difference between two balanced signals with respect to a frequency can be reduced in a wider frequency range.

The balanced-unbalanced transformation device may further include a high-frequency circuit connected to at least one of the first balanced terminal, the second balanced terminal, and the unbalanced terminal.

In such a structure, a balanced-unbalanced transformation device that performs suitable balanced-unbalanced conversion over a wide frequency range and that has a balanced-unbalanced conversion circuit and a high-frequency circuit integrated therein can be provided.

A method for manufacturing the balanced-unbalanced transformation device includes a dividing step of dividing a plate-like dielectric host substrate having electrodes serving as the first and second ¼ wavelength resonator transmission lines and the ½ wavelength resonator transmission line formed on a first major surface thereof and the ground electrode formed on a second major surface thereof so as to form a plurality of element bodies, and a side surface electrode forming step of forming the side surface electrode of the balancing characteristic adjustment electrode by printing an electrically conductive paste on a side surface of each of the element bodies from the major surface electrode to the ground electrode, drying the element body, and firing the element body.

In this way, a balanced-unbalanced transformation device that performs suitable balanced-unbalanced conversion over a wide frequency range can be manufactured by simply printing the side surface electrode of the balancing characteristic adjustment electrode.

According to the method of the present invention, the side surface electrode forming step involves optimizing the line width or the layout of the side surface electrode of the balancing characteristic adjustment electrode for an element body sampled from the plurality of element bodies formed in the dividing step and, subsequently, forming the side surface electrode for all of the element bodies using the optimized line width or layout.

This manufacturing method can increase the mass productivity of a balanced-unbalanced transformation device that can provide suitable balanced-unbalanced conversion over a wide frequency range.

According to the balanced-unbalanced transformation device of the present invention, by appropriately determining the phase difference and the amplitude difference between two balanced signals, two balanced signals having opposite phases can be obtained over a wide frequency range. In addition, the mass productivity of the balanced-unbalanced transformation device can be increased.

REFERENCE NUMERALS

Figure 1:
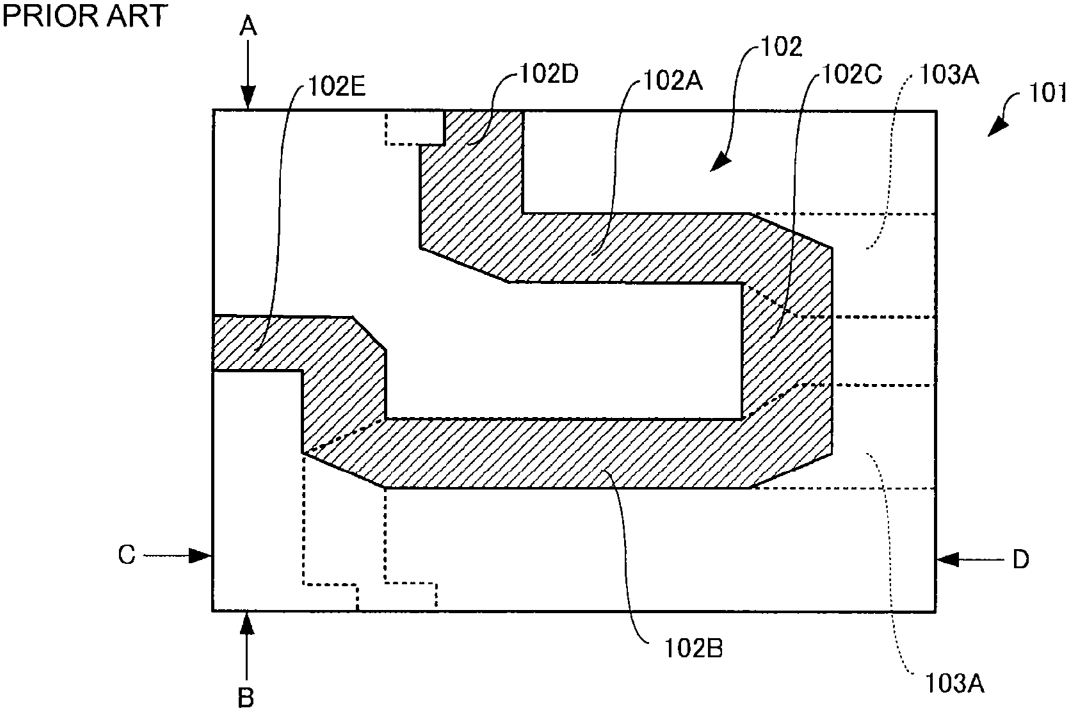
FIG. 1 PRIOR ART
FIG. 1 illustrates the structure of an existing balanced-unbalanced transformation device.

1 balanced-unbalanced transformation device
2 glass layer
10 dielectric substrate
11A, 11B short-circuit side surface electrode
12A, 12B, 12C tap connection lead-out electrode
13A, 13B, 14 major surface electrode
14A, 14B, 14C, 14D line portion
15 ground electrode
16A, 16B, 16C terminal electrode
18 balancing characteristic adjustment side surface electrode
19 balancing characteristic adjustment major surface electrode

DETAILED DESCRIPTION OF THE INVENTION

A balanced-unbalanced transformation device according to a first embodiment of the present invention is described with reference to the accompanying drawings. The description is made with reference to a Cartesian coordinate system (X-Y-Z axis) illustrated in the drawings.

Figure 2:
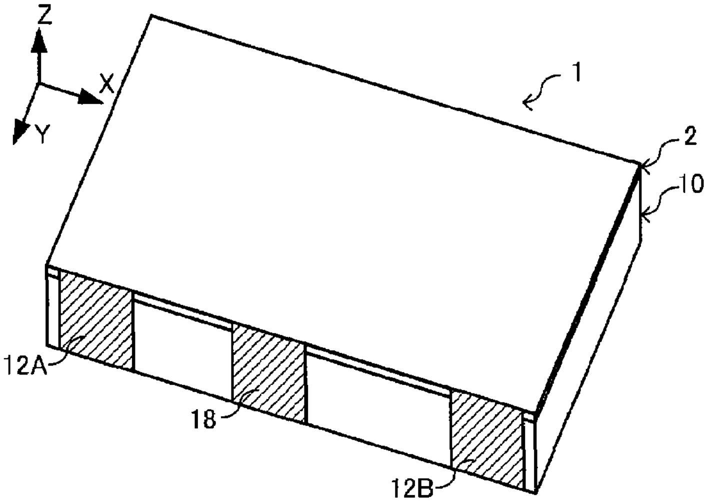
FIG. 2 is a perspective view illustrating a balanced-unbalanced transformation device according to a first embodiment of the present invention.
Figure 2:
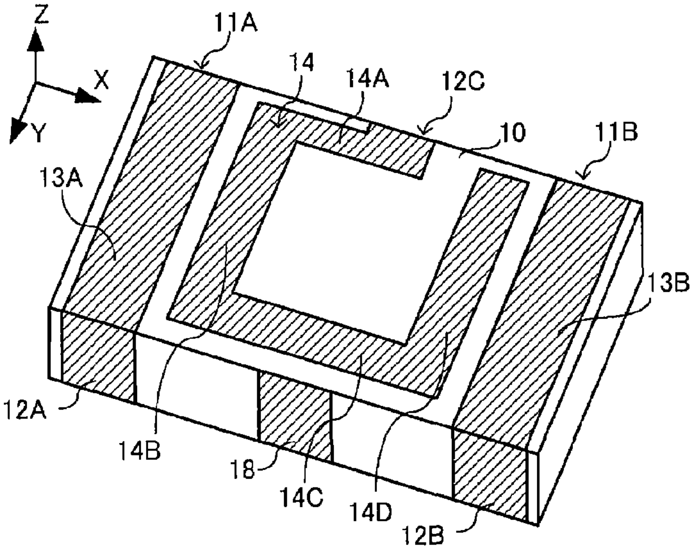
Figure 2:
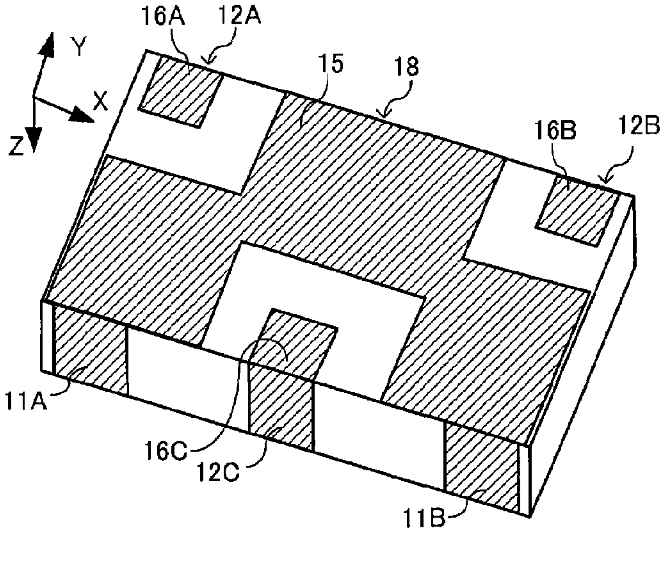

The structure of the balanced-unbalanced transformation device is schematically described first. FIG. 2(A) is a perspective view of a balanced-unbalanced transformation device 1 disposed so that a first major surface thereof (a +Z surface) faces upward, a front surface thereof (a +Y surface) faces the front left, and a right side surface thereof (a +X surface) faces the front right.

The balanced-unbalanced transformation device 1 is a small balun device having a rectangle parallelepiped shape. The balanced-unbalanced transformation device 1 is used for ultra wide band (UWB) communication. In the balanced-unbalanced transformation device 1, a first major surface of a dielectric substrate 10 having a rectangular plate shape is covered by a glass layer 2. The thickness of the dielectric substrate 10 (the dimension in the Z-axis direction) is 500 μm. The thickness of the glass layer 2 (the dimension in the Z-axis direction) is in the range from 15 to 30 μm. The external dimensions of the balanced-unbalanced transformation device 1 are about 2.5 mm in the X-axis direction, about 2.0 mm in the Y-axis direction, and about 0.56 mm in the Z-axis direction.

The dielectric substrate 10 is formed from a ceramic dielectric material, such as oxidized titanium. The relative permittivity of the dielectric substrate 10 is about 110. The glass layer 2 is formed by screen printing of glass paste composed of electrically insulating materials, such as crystalline $SiO_2$ and borosilicate glass, and, subsequently, firing the glass paste. The glass layer 2 has a laminated structure (not shown) of a transparent glass layer and a light-blocking glass layer.

The transparent glass layer is disposed so as to be in contact with the dielectric substrate 10. The transparent glass layer has a high bonding strength with respect to the dielectric substrate 10, and therefore, peeling of a circuit pattern formed on the dielectric substrate 10 is prevented. Accordingly, a front surface electrode described below and the balanced-unbalanced transformation device 1 can have high resistance to the environment. In addition, the light-blocking glass layer is formed by laminating glass containing an inorganic pigment on top of the transparent glass layer. The light-blocking glass layer enables printing of letters on the surface of the balanced-unbalanced transformation device 1. In addition, the light-blocking glass layer provides security protection for the internal circuit pattern. Note that the glass layer 2 does not necessarily have a two-layer structure. For example, the glass layer 2 may have a single-layer structure. Alternatively, the need for the glass layer 2 may be eliminated. The composition and dimensions of each of the dielectric substrate 10 and the glass layer 2 can be appropriately determined in accordance with the degree of adhesion between the dielectric substrate 10 and the glass layer 2, required resistance to the environment, and a required frequency characteristic.

When a side surface electrode described below is formed by printing, electrode paste may seep onto the first major surface of the balanced-unbalanced transformation device 1, that is, the first major surface of the glass layer 2. Thus, a plurality of runoff electrodes (not shown) are formed. However, in some cases under certain printing conditions, these runoff electrodes are not formed. In addition, when a side surface electrode is formed by printing, electrode paste may seep onto the second major surface of the balanced-unbalanced transformation device 1. Runoff electrodes formed on the second major surface are integrated into a ground electrode 15 and terminal electrodes 16A, 16B, and 16C. Since the glass layer 2 is laminated on the first major surface of the dielectric substrate 10, unwanted short circuits occurring on the major surface electrode caused by the runoff electrode formed when the side surface electrode is printed can be prevented.

FIG. 2(B) illustrates the balanced-unbalanced transformation device 1 when the glass layer 2 is removed from the balanced-unbalanced transformation device 1. FIG. 2(B) is a perspective view of the balanced-unbalanced transformation device 1 disposed so that the first major surface thereof (a +Z surface) faces upward, the front surface thereof (a +Y surface) faces the front left, and the right side surface thereof (a +X surface) faces the front right. FIG. 2(C) is a perspective view of the balanced-unbalanced transformation device 1 when the dielectric substrate 10 is rotated 180° about the X-axis from the position shown in FIG. 2(B). In FIG. 2(C), the second major surface thereof (a −Z surface) faces upward, the rear surface thereof (a −Y surface) faces the front left, and the right side surface thereof (a +X surface) faces the front right.

A plurality of major surface electrodes 13A, 13B, and 14 are formed on the first major surface of the dielectric substrate 10 serving as an interlayer between the dielectric substrate 10 and the glass layer 2. The major surface electrodes 13A, 13B, and 14 form a stripline resonator. Each of the major surface electrodes 13A, 13B, and 14 is a silver electrode having a thickness of about 6 μm (a thickness in the Z-axis direction) and is formed by a photolithographic technique using photosensitive silver paste.

The ground electrode 15 and the terminal electrodes 16A, 16B, and 16C are disposed on the second major surface of the dielectric substrate 10, that is, the second major surface of the balanced-unbalanced transformation device 1. The ground electrode 15 serves as a ground electrode of the stripline resonator. The ground electrode 15 further functions as an electrode used when the balanced-unbalanced transformation device 1 is mounted on a packaging substrate. The terminal electrodes 16A, 16B, and 16C are connected to a high-frequency signal input and output terminal when the balanced-unbalanced transformation device 1 is mounted on a packaging substrate. The terminal electrodes 16A and 16B are used as balanced terminals. The terminal electrode 16C is used as an unbalanced terminal. The ground electrode 15 is formed on the dielectric substrate 10 so as to cover a substantially entire second major surface of the dielectric substrate 10. The terminal electrodes 16A and 16B are disposed in the vicinities of the corners so as to be in contact with the front side surface. Each of the terminal electrodes 16A and 16B is separated from the ground electrode 15. The terminal electrode 16C is disposed in the vicinity of the center so as to be in contact with the rear side surface. The terminal electrode 16C is separated from the ground electrode 15. Each of the ground electrode 15 and the terminal electrodes 16A, 16B, and 16C is formed by, for example, screen printing using electrically conductive paste and firing the paste so as to have a thickness of about 15 μm (a thickness in the Z-axis direction).

Tap connection lead-out electrodes 12A and 12B and a balancing characteristic adjustment side surface electrode 18 are formed on a front side surface of the dielectric substrate 10. In the present embodiment, the balancing characteristic adjustment side surface electrode 18 serves as a balancing characteristic adjustment electrode. Short-circuit side surface electrodes 11A and 11B and a tap connection lead-out electrode 12C are formed on a rear side surface of the dielectric substrate 10 opposite the front side surface. Each of the side surface electrodes is formed not only on the side surface of the dielectric substrate 10 but also on the side surface of the glass layer 2. Each of the side surface electrodes is a silver electrode having a rectangular shape extending from the second major surface of the dielectric substrate 10 to the first major surface of the glass layer 2 in the Z-axis direction. Each of the side surface electrodes is formed by, for example, screen printing using electrically conductive paste and firing the paste so as to have a thickness of about 15 μm (a thickness in the Y-axis direction). In the present embodiment, the widths of the side surface electrodes are the same. However, the widths may be different. In addition, in the present embodiment, each of the balancing characteristic adjustment side surface electrode 18 and the tap connection lead-out electrode 12C is disposed at the center of the surface on which it is formed. However, each of the balancing characteristic adjustment side surface electrode 18 and the tap connection lead-out electrode 12C may be disposed at a location separated from the center.

The short-circuit side surface electrodes 11A and 11B electrically connect the major surface electrodes 13A and 13B to the ground electrode 15, respectively. In addition, the tap connection lead-out electrodes 12A, 12B, and 12C electrically connect the major surface electrodes 13A, 13B, and 14 to the terminal electrodes 16A, 16B, and 16C, respectively.

The thickness of each of the major surface electrodes 13A, 13B, and 14 is set to about 6 μm, while the thickness of each of the short-circuit side surface electrodes 11A and 11B is set to about 15 μm. Since the thickness of the short-circuit side surface electrodes 11A and 11B is larger than that of the major surface electrodes 13A, 13B, and 14, an electrical current flowing in a portion where electrical current concentration tends to occur can be distributed, and therefore, conductive loss can be reduced. This structure can achieve the balanced-unbalanced transformation device 1 having small insertion loss.

The major surface electrodes 13A and the major surface electrode 13B formed on the first major surface of the dielectric substrate 10 are electrodes each having an I shape extending along the left side surface and the right side surface of the dielectric substrate 10. Each of the major surface electrode 13A and the major surface electrode 13B forms, together with the ground electrode 15, a ¼ wavelength resonator with one end open and one end short-circuited.

The major surface electrodes 13A and the major surface electrode 13B are connected to the short-circuit side surface electrode 11A and the short-circuit side surface electrode 11B on the rear side surface of the dielectric substrate 10, respectively. In addition, the major surface electrodes 13A and the major surface electrode 13B are connected to the ground electrode 15 via the short-circuit side surface electrode 11A and the short-circuit side surface electrode 11B, respectively. Furthermore, the major surface electrodes 13A is connected to the tap connection lead-out electrodes 12A on the front side so as to be electrically connected to the terminal electrode 16A via the tap connection lead-out electrodes 12A. The major surface electrodes 13B is connected to the tap connection lead-out electrodes 12B on the front side so as to be electrically connected to the terminal electrode 16B via the tap connection lead-out electrodes 12B.

The major surface electrode 14 is an electrode having a C shape that is open on the rear side. The major surface electrode 14 includes a line portion 14A extending along the rear surface from the center of the rear surface towards the left side surface, a line portion 14B extending from the end of the line portion 14A towards the front side, a line portion 14C extending from the end of the line portion 14B on the front side towards the right side surface, and a line portion 14D extending from the end of the line portion 14C on the right side surface side towards the rear surface. The line portion 14B is disposed parallel to the major surface electrode 13A. In addition, the line portion 14D is disposed parallel to the major surface electrodes 13A and 13B. The line portion 14D is terminated at the end thereof on the rear surface side. The line portion 14A is connected to the tap connection lead-out electrode 12C disposed at the center of the rear surface, and is electrically connected to the terminal electrode 16C via the tap connection lead-out electrode 12C.

Accordingly, the major surface electrode 14 forms, together with the ground electrode 15, a ½ wavelength resonator with both ends open. As described above, since the major surface electrode 14 has a curved shape, a ½ wavelength resonator having a long resonator length can be formed within a limited area of the substrate.

Note that the line width of a resonator line that forms the major surface electrodes 13A, 13B, and 14 are adjusted in order to obtain a desired frequency characteristic. In the present embodiment, the line width of the major surface electrodes 13A and 13B is equal to the line width of the major surface electrode 14. However, the line widths may be different.

By forming the major surface electrodes 13A, 13B, and 14 having such structures, the ¼ wavelength resonator including the major surface electrode 13A is interdigitally connected to the ½ wavelength resonator including the major surface electrode 14. The ¼ wavelength resonator including the major surface electrode 13B is interdigitally connected to the ½ wavelength resonator including the major surface electrode 14. In addition, the ¼ wavelength resonator including the major surface electrode 13A is tap connected to the terminal electrode 16A. The ¼ wavelength resonator including the major surface electrode 13B is tap connected to the terminal electrode 16B. The ½ wavelength resonator including the major surface electrode 14 is tap connected to the terminal electrode 16C.

In the present embodiment, the balancing characteristic adjustment side surface electrode 18 is provided on the front side surface of the dielectric substrate 10. Accordingly, a capacitance is formed between the termination portion of the balancing characteristic adjustment side surface electrode 18 and the line portion 14C of the major surface electrode 14.

As a result of this capacitance, the position of an equivalent open end of the ½ wavelength resonator formed by the major surface electrode 14 is shifted from the position in the case in which the balancing characteristic adjustment side surface electrode 18 is absent. Thus, connection between the ½ wavelength resonator formed by the major surface electrode 14 and the ¼ wavelength resonator formed by the major surface electrode 13A is affected. In addition, connection between the ½ wavelength resonator formed by the major surface electrode 14 and the ¼ wavelength resonator formed by the major surface electrode 13B is affected. Consequently, by changing the capacitance, the phase balance between balanced signals of the terminal electrode 16A and the terminal electrode 16B can be adjusted.

The capacitance formed between the termination portion of the balancing characteristic adjustment side surface electrode 18 and the line portion 14C of the major surface electrode 14 is determined by the lengths of the facing portions of the two electrodes and the distance between the two electrodes. Accordingly, the capacitance can be determined by changing any one of the line width of the balancing characteristic adjustment side surface electrode 18 and the length of the major surface electrode 14 from the side surface on the front side.

In this way, the balanced-unbalanced transformation device can function as a balanced-unbalanced transformation device that converts a balanced signal to an unbalanced signal or a balanced-unbalanced transformation device that converts an unbalanced signal to a balanced signal. The balanced-unbalanced transformation device can provide a wide frequency range characteristic using strong interdigital connection. In addition, using the above-described capacitance, the balanced-unbalanced transformation device can cause two balanced signals to have a phase difference and an amplitude difference within a desired range over a wide frequency range.

While the present embodiment has been described with reference to the balancing characteristic adjustment side surface electrode 18 disposed at the center of the side surface on the front side, the present invention is not limited thereto. However, by disposing the balancing characteristic adjustment side surface electrode 18 at the center of the side surface on the front side, the arrangement of the electrodes in the balanced-unbalanced transformation device can be brought close to a line-symmetrical arrangement.

Figure 3:
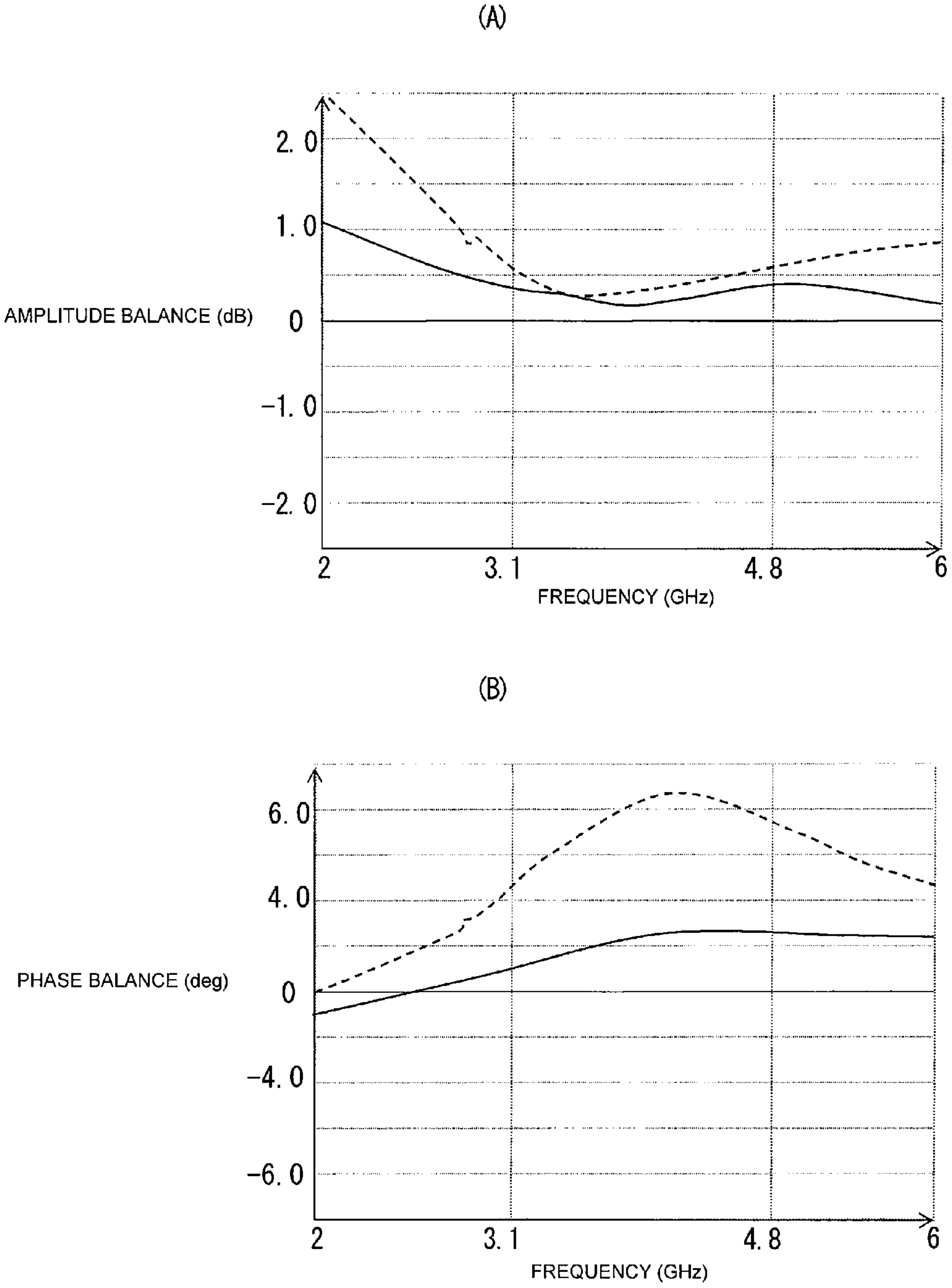
FIG. 3 is a graph illustrating a simulation result for the balanced-unbalanced transformation device according to the first embodiment.

The effect of adjustment of a balancing characteristic using the balancing characteristic adjustment side surface electrode 18 is described next with reference to FIG. 3.

A graph shown in FIG. 3(A) illustrates a simulation result of a difference between the magnitudes (the magnitude balance) of two balanced signals when the balancing characteristic adjustment side surface electrode 18 is present or absent. That is, this graph indicates the degree of difference between the magnitudes of two balanced signals. In FIG. 3(A), the abscissa represents the frequency, and the ordinate represents the difference between the magnitudes of two balanced signals. In the drawing, a solid line represents the case when the balancing characteristic adjustment side surface electrode 18 according to the present embodiment is provided. A dotted line represents a comparative case for when the balancing characteristic adjustment side surface electrode 18 is removed from the structure according to the present embodiment.

According to results of the simulation, in the structure of the present embodiment indicated by the solid line, the difference between the magnitudes of two balanced signals can be reduced over a predetermined frequency range (from 3.1 GHz to 4.8 GHz in this example), and the difference can be made uniform over the predetermined frequency range, as compared with those indicated by the dotted lines. As described above, in the structure according to the present embodiment, by appropriately determining the capacitance, a uniform amplitude characteristic can be obtained.

In this way, by providing the balancing characteristic adjustment side surface electrode 18 in a balanced-unbalanced transformation device, the difference between the magnitudes of two balanced signals can be made uniform, and two balanced signals having a difference between the magnitudes thereof in a predetermined range can be obtained over a wide frequency range.

A graph shown in FIG. 3(B) illustrates a simulation result of a difference between the phases (the phase balance) of two balanced signals when the balancing characteristic adjustment side surface electrode 18 is present or absent. That is, this graph indicates the degree of difference between the phases of two balanced signals. In FIG. 3(B), the abscissa represents the frequency, and the ordinate represents the difference between the phases of two balanced signals. In the drawing, a solid line represents the case when the balancing characteristic adjustment side surface electrode 18 according to the present embodiment is provided. A dotted line represents a comparative case for when the balancing characteristic adjustment side surface electrode 18 is removed from the structure according to the present embodiment.

According to results of the simulation, in the structure of the present embodiment indicated by the solid line, the difference between the phases of two balanced signals can be reduced over a predetermined frequency range (from 3.1 GHz to 4.8 GHz in this example), and the difference can be made uniform over the predetermined frequency range, as compared with those indicated by the dotted lines. As described above, in the structure according to the present embodiment, by appropriately determining the capacitance, a uniform phase difference characteristic can be obtained.

In this way, by providing the balancing characteristic adjustment side surface electrode 18 in a balanced-unbalanced transformation device, the difference between the phases of two balanced signals can be made uniform, and two balanced signals having a difference between the phases thereof in a predetermined range can be obtained over a wide frequency range.

The manufacturing steps of the balanced-unbalanced transformation device 1 are described next.

Figure 4:
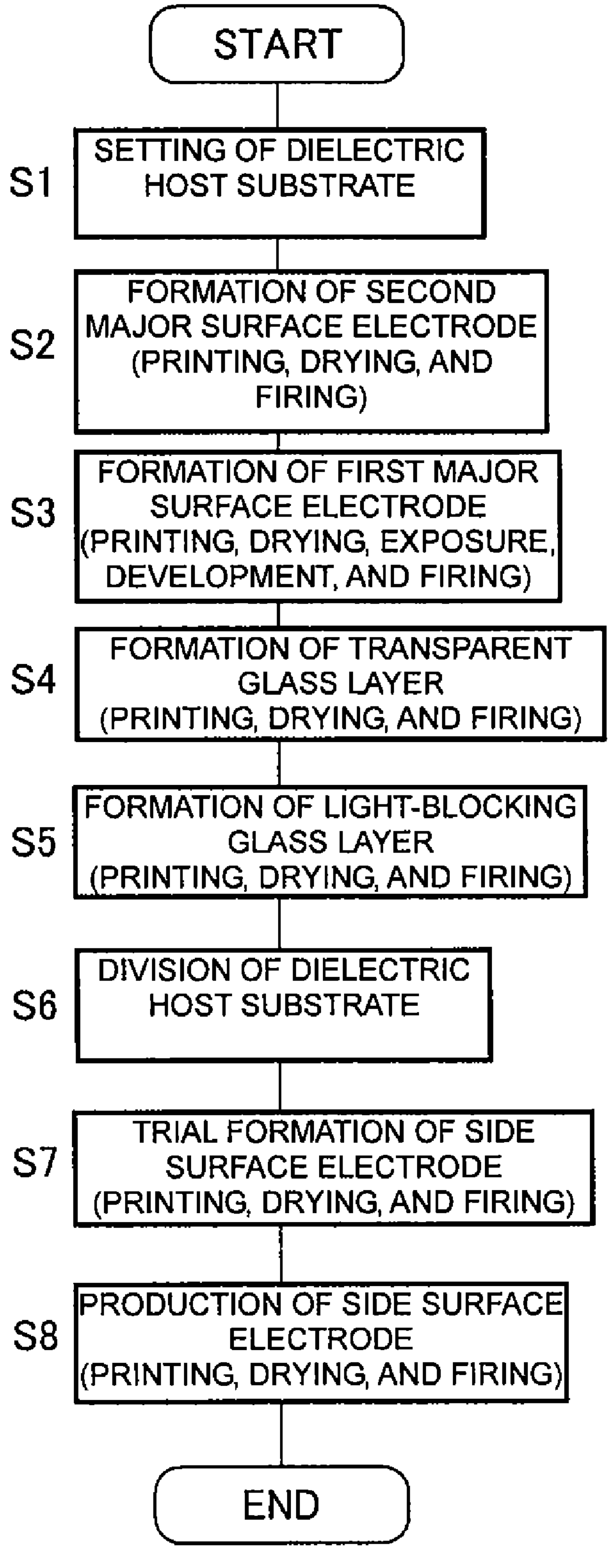
FIG. 4 is a flow diagram illustrating manufacturing steps of the balanced-unbalanced transformation device according to the first embodiment.

As shown in FIG. 4, manufacturing of the balanced-unbalanced transformation device 1 includes the following steps:

(S1) First, a dielectric host substrate having no electrodes on any surfaces thereof is prepared.

(S2) Next, conductive paste is screen-printed onto the second major surface of the dielectric host substrate. The dielectric host substrate is then dried and fired. Thus, a ground electrode and terminal electrodes are formed.

(S3) Next, photosensitive conductive paste is printed on the first major surface of the dielectric host substrate. The dielectric host substrate is then dried, is exposed to light, is developed, and is fired. Thus, major surface electrodes are formed using a photolithographic technique.

(S4) Next, glass paste is printed on the first major surface of the dielectric host substrate. The dielectric host substrate is then fired. Thus, a transparent glass layer is formed.

(S5) Next, glass paste containing inorganic pigment is printed on the first major surface of the dielectric host substrate. The dielectric host substrate is then fired. Thus, a light-blocking glass layer is formed.

(S6) Next, a plurality of element bodies are cut out from the dielectric host substrate formed through the above-described steps by, for example, dicing. After the element bodies are cut out, the electrical characteristics of the upper surface patterns of some of the cutout element bodies are preliminarily measured.

(S7) Next, one or a few cutout element bodies are selected. A balancing characteristic adjustment side surface electrode is formed by trial on the cutout element body in order to determine the line width and the layout of the balancing characteristic adjustment side surface electrode. Thus, the line width and the layout of the balancing characteristic adjustment side surface electrode optimal for obtaining a desired balancing characteristic are determined.

(S8) By trial of forming the balancing characteristic adjustment side surface electrode on the selected element body, the line width that can provide a desired balancing characteristic is determined. Thereafter, conductive paste is printed on the side surface of each of the other element bodies of the same substrate lot in a pattern having the optimal line width and layout. The element bodies are then fired. Thus, the balancing characteristic adjustment side is formed.

Using the above-described manufacturing method, the major surface electrodes are formed on the first major surface. Subsequently, the balancing characteristic adjustment side surface electrode is formed on the side surface. In this way, the balancing characteristic can be adjusted, and therefore, a desired balancing characteristic can be reliably obtained.

Figure 5:
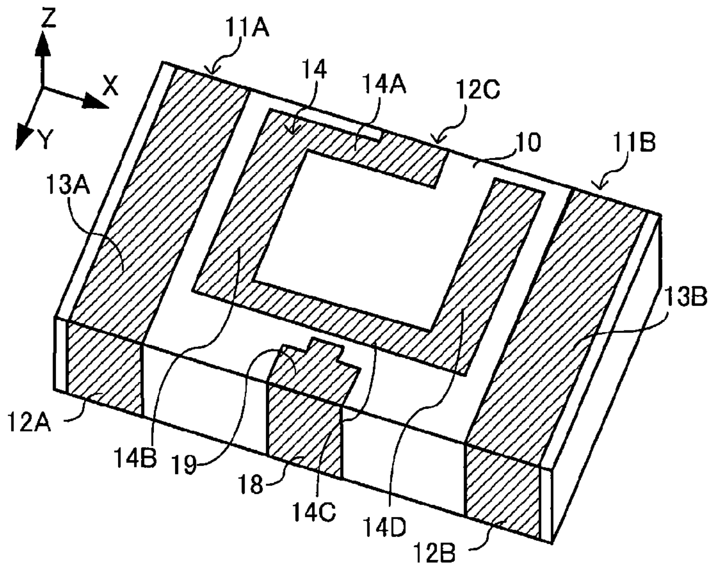
FIG. 5 is a perspective view illustrating a balanced-unbalanced transformation device according to a second embodiment of the present invention.
Figure 5:
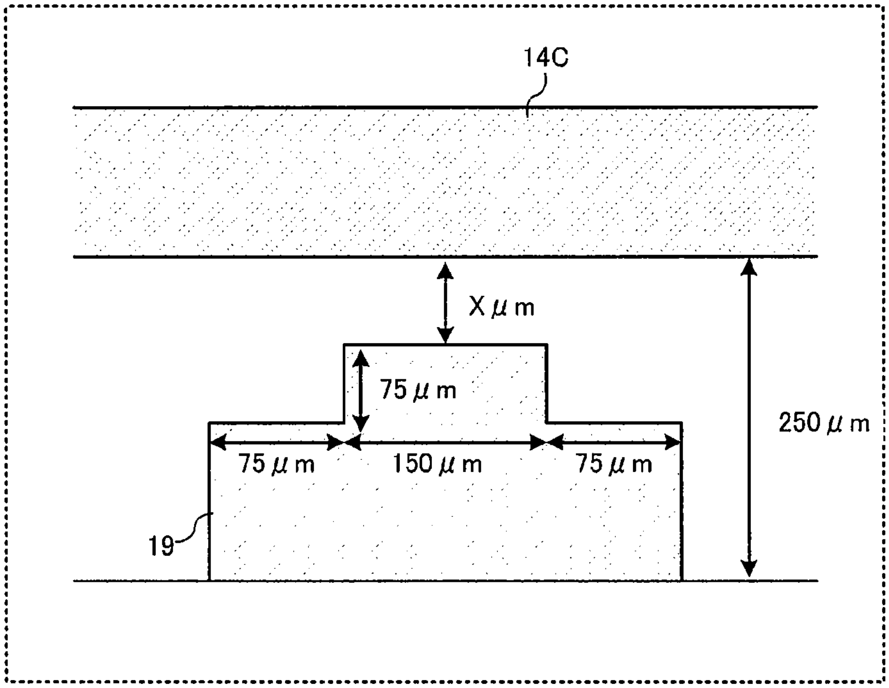

A balanced-unbalanced transformation device according to a second embodiment of the present invention is described next with reference to FIG. 5. FIG. 5(A) is a perspective view of a balanced-unbalanced transformation device according to the present embodiment disposed so that a first major surface (a +Z surface) of a dielectric substrate thereof faces upward, a front surface (a +Y surface) of the dielectric substrate faces the front left, and a right side surface (a +X surface) of the dielectric substrate faces the front right. FIG. 5(B) illustrates the dimensions of a balancing characteristic adjustment major surface electrode 19. Hereinafter, similar numbering will be used as was utilized above in the first embodiment, and the descriptions thereof are not repeated.

The balanced-unbalanced transformation device according to the present embodiment has a structure similar to that of the balanced-unbalanced transformation device according to the first embodiment. However, the present embodiment differs from the first embodiment in the following points: the location at which the line portion 14C of the major surface electrode 14 is formed is separated from the side surface on the front side, and the balancing characteristic adjustment major surface electrode 19 is provided on the first major surface on the front side. The balancing characteristic adjustment major surface electrode 19 is continuously formed from the balancing characteristic adjustment side surface electrode 18, and is electrically connected to the ground electrode via the balancing characteristic adjustment side surface electrode 18. In the present embodiment, the balancing characteristic adjustment side surface electrode 18 and the balancing characteristic adjustment major surface electrode 19 form a balancing characteristic adjustment electrode. This structure enables balancing characteristic adjustment to be more finely performed than with the balanced-unbalanced transformation device of the first embodiment.

As shown in FIG. 5(B), the location at which the line portion 14C of the major surface electrode 14 is formed is separated from the side surface on the front side by 250 μm. In addition, the balancing characteristic adjustment major surface electrode 19 has a convex top end. The top end is separated from the line portion 14C by X μm. The line width of the balancing characteristic adjustment major surface electrode 19 is 300 μm. The width of the convex top end is 150 μm, and the height of the convex top end is 75 μm. The convex top end is located at the middle of the balancing characteristic adjustment major surface electrode 19 in the width direction.

In the present embodiment, the width of the convex top end is set to 150 μm, and the height of the convex top end is set to 75 μm. However, by changing these values, a capacitance formed between the balancing characteristic adjustment major surface electrode 19 and the line portion 14C can be changed. Accordingly, in order to change the capacitance, these values may be changed. In addition, the convex top end is not necessarily located at the middle of the balancing characteristic adjustment major surface electrode 19 in the width direction.

Figure 6:
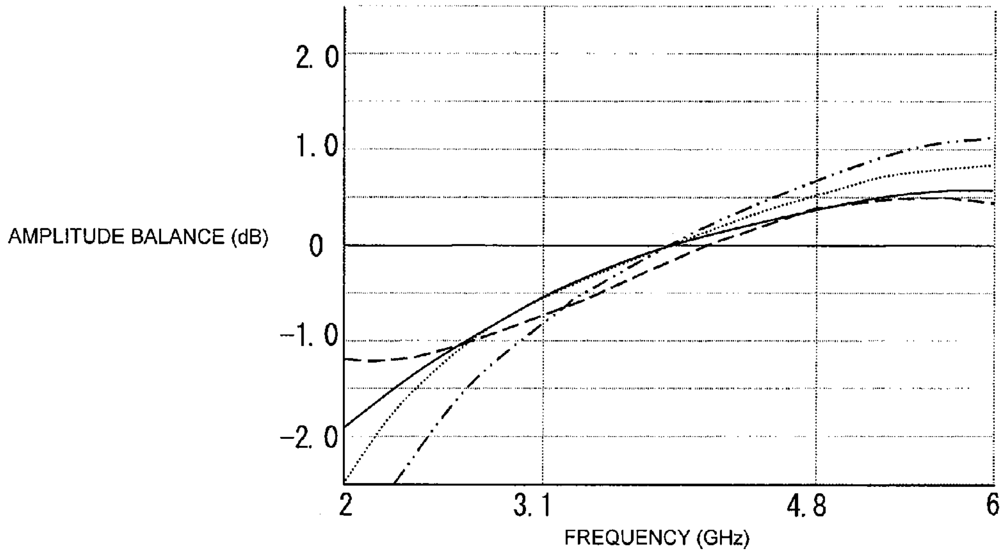
FIG. 6 is a graph illustrating a simulation result for the balanced-unbalanced transformation device according to the second embodiment.
Figure 6:
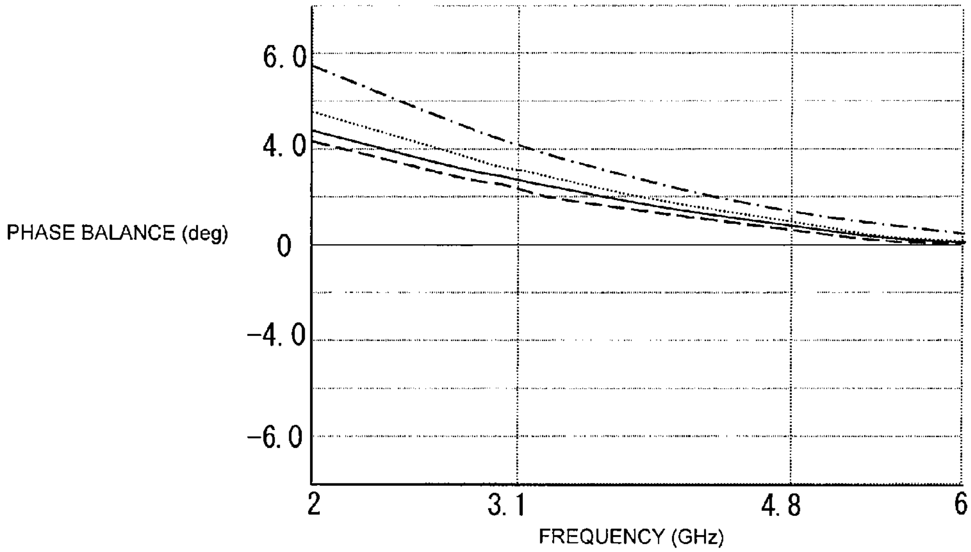

The effect of adjustment of a balancing characteristic using the balancing characteristic adjustment major surface electrode 19 is described next with reference to FIG. 6.

A graph shown in FIG. 6(A) illustrates a simulation result of a difference between the magnitudes (the magnitude balance) of two balanced signals when the distance X μm between the convex top end of the balancing characteristic adjustment major surface electrode 19 and the line portion 14C shown in FIG. 5(B) is changed to a variety of values. That is, this graph indicates the degree of difference between the magnitudes of two balanced signals.

In the graph shown in FIG. 6(A), the abscissa represents the frequency, and the ordinate represents the difference between the magnitudes of two balanced signals. In the drawing, a solid line represents the case when the distance X μm is set to 50 μm in the balanced-unbalanced transformation device according to the present embodiment. A dotted line represents the case when the distance X μm is set to 75 μm in the balanced-unbalanced transformation device according to the present embodiment. A chain line represents the case when the distance X μm is set to 25 μm in the balanced-unbalanced transformation device according to the present embodiment. In addition, an alternate long and short dash line represents a comparative case for when the balancing characteristic adjustment major surface electrode 19 is not provided in the balanced-unbalanced transformation device 1 according to the present embodiment.

According to results of the simulation, in either case, a frequency at which the difference between the magnitudes of two balanced signals becomes zero appears. In the frequency range near that frequency, the difference between the magnitudes is within a desired range.

In the case where the desired difference between the magnitudes is in the range from 2.0 dB to −2.0 dB, the chain line for the distance of 25 μm indicates that the difference between the magnitudes is in the range from 0.6 dB to −1.3 dB over a frequency range of 2 GHz to 6 GHz. Since the difference between the magnitudes is within the desired range, an optimal difference between the magnitudes is obtained over a frequency range of 2 GHz to 6 GHz. In addition, the solid line for the distance of 50 μm indicates that the difference between the magnitudes is in the range from 0.7 dB to −1.9 dB over a frequency range of 2 GHz to 6 GHz. Since the difference between the magnitudes is within the desired range, an optimal difference between the magnitudes is obtained over a frequency range of 2 GHz to 6 GHz. Furthermore, the dotted line for the distance of 75 μm indicates that the difference between the magnitudes is in the range from 0.9 dB to −2.0 dB over a frequency range of 2 GHz to 6 GHz. Since the difference between the magnitudes is within the desired range, an optimal difference between the magnitudes is obtained over a frequency range of 2 GHz to 6 GHz. However, the alternate long and short dash line for the case where the balancing characteristic adjustment major surface electrode 19 is not provided indicates that the difference between the magnitudes is smaller than 1.2 dB and exceeds −2.0 dB in a frequency range of 2 GHz to 6 GHz. That is, the difference between the magnitudes is not within the desired range. The frequency range in which the difference between the magnitudes is within the desired range is smaller than the frequency range of 2 GHz to 6 GHz.

In addition, in the frequency range of 3.1 to 4.8 GHz, the chain line for the distance of 25 μm indicates that the difference between the magnitudes changes in the range from 0.4 dB to −0.8 dB. The solid line for the distance of 50 μm indicates that the difference between the magnitudes changes in the range from 0.4 dB to −0.6 dB. The dotted line for the distance of 75 μm indicates that the difference between the magnitudes changes in the range from 0.6 dB to −0.6 dB. Furthermore, the alternate long and short dash line for the case where the balancing characteristic adjustment major surface electrode 19 is not provided indicates that the difference between the magnitudes changes in the range from 0.7 dB to −0.9 dB. Thus, in the frequency range of 3.1 to 4.8 GHz, the solid line for the distance of 50 μm shows the smallest difference between the magnitudes.

As described above, by changing the distance X μm, the amplitude characteristic can be set in a variety of ways. Accordingly, by determining the distance X μm so that the difference between the magnitudes is within a desired range over a required frequency range, two balanced signals having a difference between the magnitudes thereof in a predetermined range can be obtained over a wide frequency range.

In a graph shown in FIG. 6(B), the abscissa represents the frequency, and the ordinate represents the difference between the phases of two balanced signals. The lines in the drawing represent the same parameters as in FIG. 6(A).

According to results of the simulation, in all cases, the phase difference between two balanced signals becomes close to zero at a frequency of about 6 GHz, and a phase difference within a desired range can be obtained in the frequency range around that frequency.

In addition, in the frequency range of 2 to 6 GHz, the chain line for the distance of 25 μm shows the smallest phase difference. The solid line for the distance of 50 μm shows the next smallest phase difference. The dotted line for the distance of 75 μm shows the next smallest phase difference. The dotted line for the distance of 75 μm shows the next smallest phase difference. The alternate long and short dash line for the case where the balancing characteristic adjustment major surface electrode 19 is not provided shows the next smallest phase difference. That is, the phase difference increases in this order.

In this way, by changing the distance X μm, the phase characteristic can be changed. Accordingly, by determining the distance X μm so that the phase difference is within a desired range over a required frequency range, two balanced signals having a phase difference therebetween in a predetermined range can be obtained over a wide frequency range.

As described above, by providing the balancing characteristic adjustment major surface electrode 19 in the balanced-unbalanced transformation device, the phase difference and the amplitude difference between two balanced signals and variations in the phase difference and the amplitude difference can be finely determined. In addition, by appropriately determining the capacitance, two balanced signals having a phase difference therebetween in a predetermined range can be obtained over a wide frequency range.

The arrangements of the major surface electrodes and the short-circuit side surface electrodes of the above-described embodiments have been described for a product specification. Any shapes of the major surface electrodes and the side surface electrodes can be employed in accordance with the product specification. The present invention is applicable to any structure in addition to the above-described structures, and is applicable to balanced-unbalanced transformation devices having a variety of shapes of patterns. In addition, another structure (a high-frequency circuit) may be disposed in the balanced-unbalanced transformation device.

The invention claimed is:

1. A balanced-unbalanced transformation device comprising:

a dielectric substrate having first and second opposing surfaces;

first and second ¼ wavelength resonator transmission lines positioned on the first surface of the dielectric substrate, each having a first end short-circuited and a second end open-circuited;

a ground electrode positioned on the second surface of the dielectric substrate;

a ½ wavelength resonator transmission line positioned on the first surface of the dielectric substrate and having a first line portion disposed in a vicinity of the first ¼ wavelength resonator transmission line and a second line portion disposed in a vicinity of the second ¼ wavelength resonator transmission line, the ½ wavelength resonator transmission line having either end thereof open-circuited;

a first balanced terminal connected to the first ¼ wavelength resonator transmission line;

a second balanced terminal connected to the second ¼ wavelength resonator transmission line;

an unbalanced terminal connected to the ½ wavelength resonator transmission line; and a balancing characteristic adjustment electrode having one end thereof connected to the ground electrode, the balancing characteristic adjustment electrode facing a side of a portion of the ½ wavelength resonator transmission line located between the first and second line portions.

2. The balanced-unbalanced transformation device according to claim 1, wherein the open-circuited second ends of the first and second ¼ wavelength resonator transmission lines extend in the same direction, and the open-circuited end of the ½ wavelength resonator transmission line extends in a direction opposite the direction in which the open-circuited second ends of the first and second ¼ wavelength resonator transmission lines extend.

3. The balanced-unbalanced transformation device according to claim 1, wherein the balancing characteristic adjustment electrode includes a side surface electrode positioned on a side surface of the dielectric substrate between the first and second surfaces, and a major surface electrode disposed on the first surface of the dielectric substrate.

4. The balanced-unbalanced transformation device according to claim 3, wherein the major surface electrode of the balancing characteristic adjustment electrode has a convex shape protruding towards a side of the ½ wavelength resonator transmission line.

5. The balanced-unbalanced transformation device according to claim 3, further comprising:

first and second lead-out electrodes disposed on the side surface of the dielectric substrate, the first lead-out electrode electrically connecting the first balanced terminal to the first ¼ wavelength resonator transmission line, the second lead-out electrode electrically connecting the second balanced terminal to the second ¼ wavelength resonator transmission line.

6. The balanced-unbalanced transformation device according to claim 3, wherein the first lead-out electrode, the side surface electrode of the balancing characteristic adjustment electrode, and the second lead-out electrode are disposed at equal intervals.

7. The balanced-unbalanced transformation device according to claim 1, further comprising:

a high-frequency circuit connected to at least one of the first balanced terminal, the second balanced terminal, and the unbalanced terminal.

8. A method for manufacturing the balanced-unbalanced transformation device, the balanced-unbalanced transformation device comprising a dielectric substrate having first and second opposing surfaces; first and second ¼ wavelength resonator transmission lines positioned on the first surface of the dielectric substrate, each having a first end short-circuited and a second end open-circuited; a ground electrode positioned on the second surface of the dielectric substrate; a ½ wavelength resonator transmission line positioned on the first surface of the dielectric substrate and having a first line portion disposed in a vicinity of the first ¼ wavelength resonator transmission line and a second line portion disposed in a vicinity of the second ¼ wavelength resonator transmission line, the ½ wavelength resonator transmission line having either end thereof open-circuited a first balanced terminal connected to the first ¼ wavelength resonator transmission line a second balanced terminal connected to the second ¼ wavelength resonator transmission line an unbalanced terminal connected to the ½ wavelength resonator transmission line and a balancing characteristic adjustment electrode having one end thereof connected to the ground electrode, the balancing characteristic adjustment electrode facing a side of a portion of the ½ wavelength resonator transmission line located between the first and second line portions, the method comprising:

dividing a plate-like dielectric host substrate having electrodes defining the first and second ¼ wavelength resonator transmission lines and the ½ wavelength resonator transmission line formed on a first surface of the plate-like dielectric host substrate and the ground electrode formed on a second surface of the plate-like dielectric host substrate so as to form a plurality of element bodies; and forming the side surface electrode of the balancing characteristic adjustment electrode.

9. The method for manufacturing a balanced-unbalanced transformation device according to claim 8, wherein the side surface electrode is formed by printing an electrically conductive paste on a side surface of each of the element bodies from the first surface to the second surface, drying the element body, and firing the element body.

10. The method for manufacturing a balanced-unbalanced transformation device according to claim 9, wherein the side surface electrode is further formed by one of optimizing the line width and the layout of the side surface electrode of the balancing characteristic adjustment electrode for an element body sampled from the plurality of element bodies formed and, subsequently, forming the side surface electrode for the remaining plurality of element bodies using one of the optimized line width and layout.

* * * * *